United States Patent
Shih (10) Patent No.: US 11,177,194 B2
(45) Date of Patent: Nov. 16, 2021

(54) SEMICONDUCTOR DEVICE WITH INTERCONNECT STRUCTURE AND METHOD FOR PREPARING THE SAME

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 83 days.

(21) Appl. No.: 16/719,129

(22) Filed: Dec. 18, 2019

(65) Prior Publication Data

US 2021/0193559 A1  Jun. 24, 2021

(51) Int. Cl.
*H01L 23/485* (2006.01)
*H01L 23/00* (2006.01)
*H01L 23/31* (2006.01)
*H01L 23/482* (2006.01)

(52) U.S. Cl.
CPC ........ *H01L 23/485* (2013.01); *H01L 23/3192* (2013.01); *H01L 23/4827* (2013.01); *H01L 24/03* (2013.01); *H01L 24/05* (2013.01); *H01L 24/11* (2013.01); *H01L 24/13* (2013.01); *H01L 2224/02122* (2013.01); *H01L 2224/03015* (2013.01); *H01L 2224/0401* (2013.01); *H01L 2224/11011* (2013.01); *H01L 2224/13006* (2013.01); *H01L 2224/13016* (2013.01); *H01L 2224/1357* (2013.01)

(58) Field of Classification Search
CPC ........................................................ H01L 24/03
See application file for complete search history.

(56) References Cited

U.S. PATENT DOCUMENTS

2017/0098627 A1* 4/2017 Das ........................ H01L 24/81

FOREIGN PATENT DOCUMENTS

| TW | 201705372 A | 2/2017 |
|----|-------------|--------|
| TW | 201715688 A | 5/2017 |
| TW | 201801278 A | 1/2018 |

* cited by examiner

*Primary Examiner* — William A Harriston
(74) *Attorney, Agent, or Firm* — Muncy, Geissler, Olds & Lowe, P.C.

(57) ABSTRACT

A semiconductor device includes a conductive pattern disposed over a semiconductor substrate, and an interconnect structure disposed over the conductive pattern. The semiconductor device also includes an interconnect liner formed between the interconnect structure and the conductive pattern and surrounding the interconnect structure. The inner sidewall surfaces of the interconnect liner are in direct contact with the interconnect structure, and a maximum distance between outer sidewall surfaces of the interconnect liner is greater than a width of the conductive pattern. The semiconductor device further includes a semiconductor die bonded to the semiconductor substrate. The semiconductor die includes a conductive pad facing the interconnect structure, wherein the conductive pad is electrically connected to the conductive pattern.

18 Claims, 10 Drawing Sheets

SEMICONDUCTOR DEVICE WITH INTERCONNECT STRUCTURE AND METHOD FOR PREPARING THE SAME

TECHNICAL FIELD

The present disclosure relates to a semiconductor device and a method for preparing the same, and more particularly, to a semiconductor device with an interconnect structure and a method for preparing the same.

DISCUSSION OF THE BACKGROUND

Semiconductor devices are essential for many modern applications. With the advancement of electronic technology, semiconductor devices are becoming smaller in size while having greater functionality and greater amounts of integrated circuitry. Due to the miniaturized scale of semiconductor devices, various types and dimensions of semiconductor devices performing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices is becoming increasingly complicated. An increase in complexity of manufacturing and integration of the semiconductor device may cause deficiencies, such as undesirable voids in the conductive elements, which are formed by filling of openings. Accordingly, there is a continuous need to improve the manufacturing process of semiconductor devices so that the deficiencies can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a conductive pattern formed over a semiconductor substrate, and an interconnect structure formed over the conductive pattern. The semiconductor device also includes an interconnect liner formed between the interconnect structure and the conductive pattern and surrounding the interconnect structure. The inner sidewall surfaces of the interconnect liner are in direct contact with the interconnect structure, and a maximum distance between outer sidewall surfaces of the interconnect liner is greater than a width of the conductive pattern. The semiconductor device further includes a semiconductor die bonded to the semiconductor substrate. The semiconductor die includes a conductive pad facing the interconnect structure, and the conductive pad is electrically connected to the conductive pattern.

In some embodiments, a width of the interconnect structure is greater than the width of the conductive pattern.

In some embodiments, the interconnect liner has a protruding portion in direct contact with a sidewall surface of the conductive pattern.

In some embodiments, the semiconductor device further comprises a sidewall spacer disposed on the sidewall surface of the conductive pattern, wherein the protruding portion of the interconnect liner is in direct contact with the sidewall spacer.

In some embodiments, the semiconductor device further comprises a lining layer covering the semiconductor substrate and a sidewall surface of the sidewall spacer, wherein a material of the lining layer is the same as a material of the sidewall spacer.

In some embodiments, the semiconductor device further comprises a first passivation layer disposed over the lining layer and surrounding the interconnect liner; and a second passivation layer disposed over the first passivation layer and surrounding the interconnect liner, wherein the interconnect structure and the interconnect liner protrude from the second passivation layer.

In some embodiments, the first passivation layer is made of silicon oxide, and the second passivation layer, the lining layer and the sidewall spacer are made of silicon nitride.

In another embodiment of the present disclosure, a semiconductor device is provided. The semiconductor device includes a conductive pattern formed over a semiconductor substrate, and an interconnect structure formed over the conductive pattern. The semiconductor device also includes an interconnect liner formed between the interconnect structure and the conductive pattern and surrounding the interconnect structure. The interconnect liner has a protruding portion in direct contact with a sidewall surface of the conductive pattern. The semiconductor device further includes a semiconductor die bonded to the semiconductor substrate. The semiconductor die includes a conductive pad, and the conductive pad is electrically connected to the conductive pattern through the interconnect structure and the interconnect liner.

In some embodiments, the semiconductor device further comprises a sidewall spacer disposed on the sidewall surface of the conductive pattern; and a lining layer covering the semiconductor substrate and the sidewall spacer, wherein the sidewall spacer is enclosed by the protruding portion of the interconnect liner, the conductive pattern, the semiconductor substrate and the lining layer.

In some embodiments, a topmost point of the lining layer is higher than a bottom surface of the protruding portion of the interconnect liner.

In some embodiments, the semiconductor device further comprises a first passivation layer disposed over the lining layer; and a second passivation layer disposed over the first passivation layer, wherein the first passivation layer and the second passivation layer are made of different materials, and wherein the first passivation layer and the second passivation layer adjoin a sidewall surface of the interconnect liner, and a top surface of the interconnect liner is higher than a top surface of the second passivation layer.

In some embodiments, the interconnect structure has a tapered width, which is tapered from a top portion to a bottom portion.

In some embodiments, the conductive pad is in direct contact with the interconnect structure and the interconnect liner.

In one embodiment of the present disclosure, a method for preparing a semiconductor device is provided. The method includes forming a conductive pattern over a semiconductor substrate, and forming a sidewall spacer on a sidewall surface of the conductive pattern. The method also includes forming a first passivation layer covering the conductive pattern and the sidewall spacer, and removing a portion of the first passivation layer and a portion of the sidewall spacer such that a top surface and the sidewall surface of the conductive pattern are exposed by a first opening. The method further includes forming an interconnect liner and an interconnect structure in the first opening, wherein the interconnect structure is separated from the conductive pattern by the interconnect liner. In addition, the method includes bonding a semiconductor die to the semiconductor substrate. The semiconductor die includes a conductive pad facing the interconnect structure, wherein the conductive pad is electrically connected to the conductive pattern.

In some embodiments, the interconnect structure is separated from the first passivation layer by the interconnect liner, and the top surface of the conductive pattern is higher than a bottom surface of the interconnect liner.

In some embodiments, the method for preparing a semiconductor device further comprises: forming a lining layer covering the semiconductor substrate, the sidewall spacer and the conductive pattern before the first passivation layer is formed, wherein a material of the lining layer is different from a material of the first passivation layer.

In some embodiments, the lining layer is partially removed during the step of forming the first opening.

In some embodiments, the interconnect liner has a protruding portion sandwiched between the lining layer and the conductive pattern.

In some embodiments, the method for preparing a semiconductor device further comprises: forming a second passivation layer over the first passivation layer before the first opening is formed; and removing a portion of the second passivation layer to form a second opening before the first opening is formed, wherein a width of the second opening is greater than a width of the first opening.

In some embodiments, a top surface of the interconnect liner is higher than a top surface of the second passivation layer before the semiconductor die is bonded to the semiconductor substrate.

Embodiments of a semiconductor device are provided in accordance with the present disclosure. The semiconductor device includes a conductive pattern over a semiconductor substrate, an interconnect structure over the conductive pattern, and a semiconductor die bonded to the semiconductor substrate such that a conductive pad of the semiconductor die is electrically connected to the conductive pattern over the semiconductor substrate. The semiconductor device also includes an interconnect liner between the interconnect structure and the conductive pattern, wherein the interconnect structure is surrounded by the interconnect liner. Since a maximum distance between outer sidewall surfaces of the interconnect liner is greater than a width of the conductive pattern, the contact area between the interconnect structure and the conductive pad of the semiconductor die is increased. This may cause a corresponding decrease of the resistance between the interconnect structure and the conductive pad. As a result, the overall device performance may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
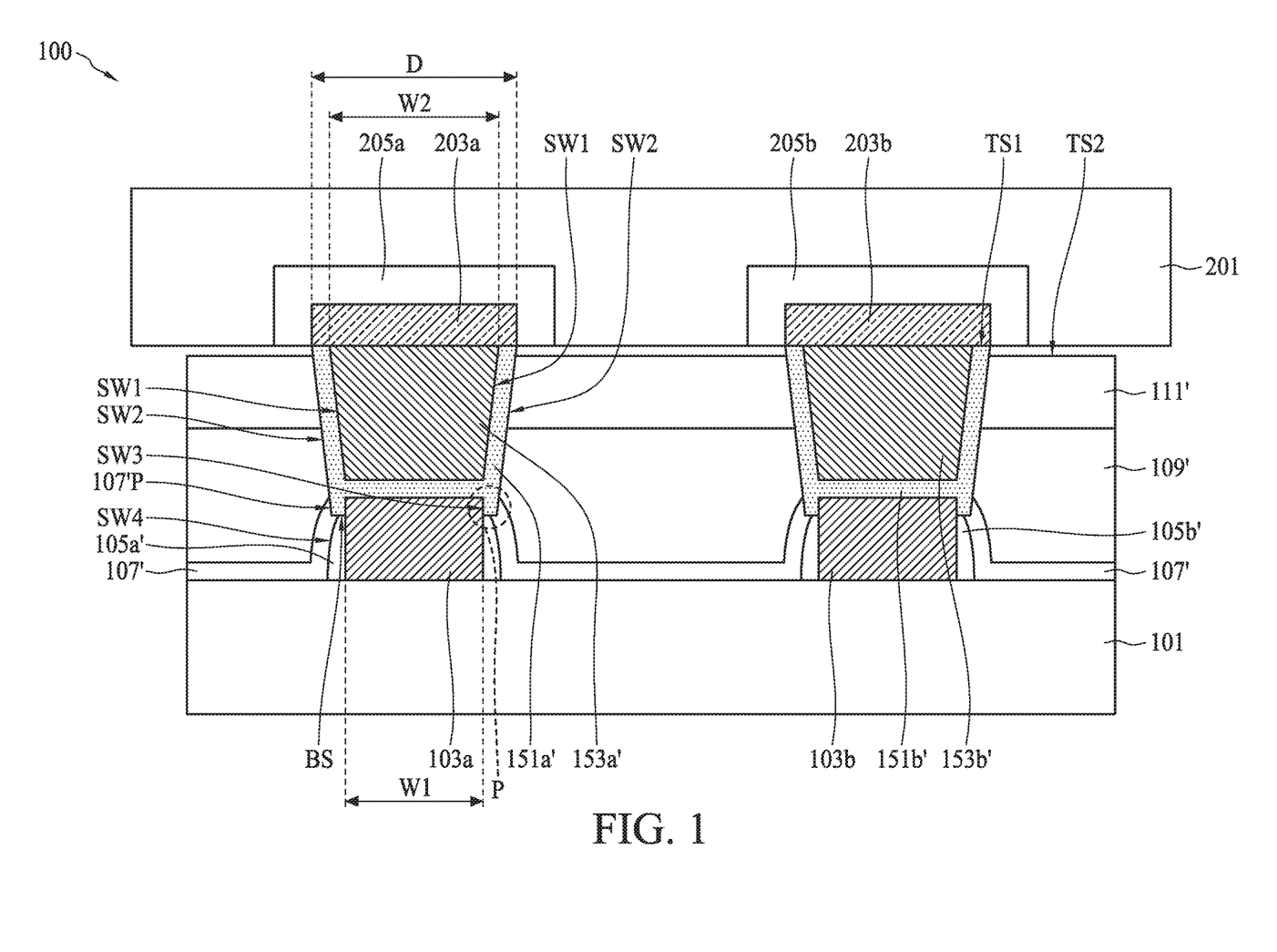
FIG. 1 is a cross-sectional view illustrating a semiconductor device, in accordance with some embodiments.

FIG. 1 is a cross-sectional view illustrating a semiconductor device 100, in accordance with some embodiments. As shown in FIG. 1, the semiconductor device 100 includes conductive patterns 103a and 103b, sidewall spacers 105a' and 105b', and a lining layer 107' over a semiconductor substrate 101, in accordance with some embodiments. It should be noted that the semiconductor substrate 101 may include various devices, and the conductive patterns 103a and 103b are used to electrically connect the devices in the semiconductor substrate 101 to other dies bonded thereon, such as a semiconductor die 201, which will be described in more detail later.

Moreover, in some embodiments, the sidewall spacers 105a' and 105b' are formed over sidewall surfaces SW3 of the conductive patterns 103a and 103b, and the lining layer 107' covers the semiconductor substrate 101 and sidewall surfaces SW4 of the sidewall spacers 105a' and 105b'. For the purpose of simplicity and clarity, the sidewall surfaces SW3 and SW4 are only designated in the left portion of FIG. 1. However, the right portion of FIG. 1 may have features similar to those of the left portion. In some embodiments, the lining layer 107' is separated from the conductive patterns 103a and 103b by the sidewall spacers 105a' and 105b'.

Moreover, the semiconductor device 100 also includes interconnect liners 151a', 151b' and interconnect structures 153a', 153b' over the conductive patterns 103a and 103b. In some embodiments, the interconnect structures 153a' and 153b' are separated from the conductive patterns 103a and 103b by the interconnect liners 151a' and 151b', and the interconnect liners 151a' and 151b' surround the interconnect structures 153a' and 153b', respectively.

It should be noted that the interconnect liner 151a' has inner sidewall surfaces SW1 and outer sidewall surfaces SW2, and the conductive pattern 103a has a width W1. The inner sidewall surfaces SW1 of the interconnect liner 151a' are in direct contact with the interconnect structure 153a', and a maximum distance D between the outer sidewall surfaces SW2 of the interconnect liner 151a' is greater than the width W1 of the conductive pattern 103a, in accordance with some embodiments.

In some embodiments, the interconnect structure 153a' has a width W2, and the width W2 is greater than the width W1 of the conductive pattern 103a. In other words, the interconnect structure 153a' has a tapered width which is tapered from its top portion to its bottom portion, in accordance with some embodiments. For the purpose of simplicity and clarity, the sidewall surfaces SW3 and SW4, the maximum distance D, and the widths W1 and W2 are only designated in the left portion of FIG. 1. However, the right portion of FIG. 1 may have features similar to those of the left portion.

In addition, the interconnect liner 151a' has protruding portions P in direct contact with the sidewall surfaces SW3 of the conductive pattern 103a, in accordance with some embodiments. In some embodiments, the protruding portions P are in direct contact with the sidewall spacers 105a'. Moreover, in some embodiments, the sidewall spacers 105a' are enclosed by the protruding portions P, the conductive pattern 103a, the semiconductor substrate 101, and the lining layer 107'. In some embodiments, the topmost point 107'P of the lining layer 107' is higher than the bottom surface BS of the protruding portions P.

For the purpose of simplicity and clarity, the protruding portions P, the topmost point 107'P and the bottom surface BS are only designated in the left portion of FIG. 1. However, the right portion of FIG. 1 may have features similar to those of the left portion.

Still referring to FIG. 1, the semiconductor device 100 includes a first passivation layer 109' over the lining layer 107' and a second passivation layer 111' over the first passivation layer 109', in accordance with some embodiments. In some embodiments, the first passivation layer 109' and the second passivation layer 111' surround the interconnect liners 151a', 151b' and the interconnect structures 153a', 153b'. Specifically, in some embodiments, the first passivation layer 109' and the second passivation layer 111' adjoin the outer sidewall surfaces SW2 of the interconnect liners 151a' and 151b'.

It should be noted that the interconnect structures 153a', 153b' and the interconnect liners 151a', 151b' protrude from the second passivation layer 111', in accordance with some embodiments. More specifically, a top surface TS1 of the interconnect liner 151b' is higher than a top surface TS2 of the second passivation layer 111', as shown in FIG. 1 in accordance with some embodiments. For the purpose of simplicity and clarity, the top surfaces TS1 and TS2 are only designated in the right portion of FIG. 1. However, the left portion of FIG. 1 may have features similar to those of the right portion.

The semiconductor device 100 further includes the semiconductor die 201 bonded to the semiconductor substrate 101. The semiconductor die 201 includes conductive pads 203a, 203b and conductive liners 205a, 205b. In some embodiments, the conductive pads 203a, 203b and the conductive liners 205a, 205b are embedded in the semiconductor die 201, and the conductive pads 203a and 203b are separated from the semiconductor die 201 by the conductive liners 205a and 205b.

Specifically, the semiconductor die 201 is bonded to the semiconductor substrate 101 with the conductive pads 203a and 203b facing the interconnect structures 153a' and 153b'. In some embodiments, the semiconductor die 201 is a logic die, a system-on-chip (SoC) die, a memory die, or another applicable die. The memory die may include memory devices such as static random access memory (SRAM) devices, dynamic random access memory (DRAM) devices, other suitable devices, or a combination thereof. In some embodiments, the conductive pads 203a and 203b are used to electrically connect the devices in the semiconductor die 201 to the devices in the semiconductor substrate 101 through the interconnect structures 153a' and 153b', the interconnect liners 151a' and 151b', and the conductive patterns 103a and 103b.

Figure 2:
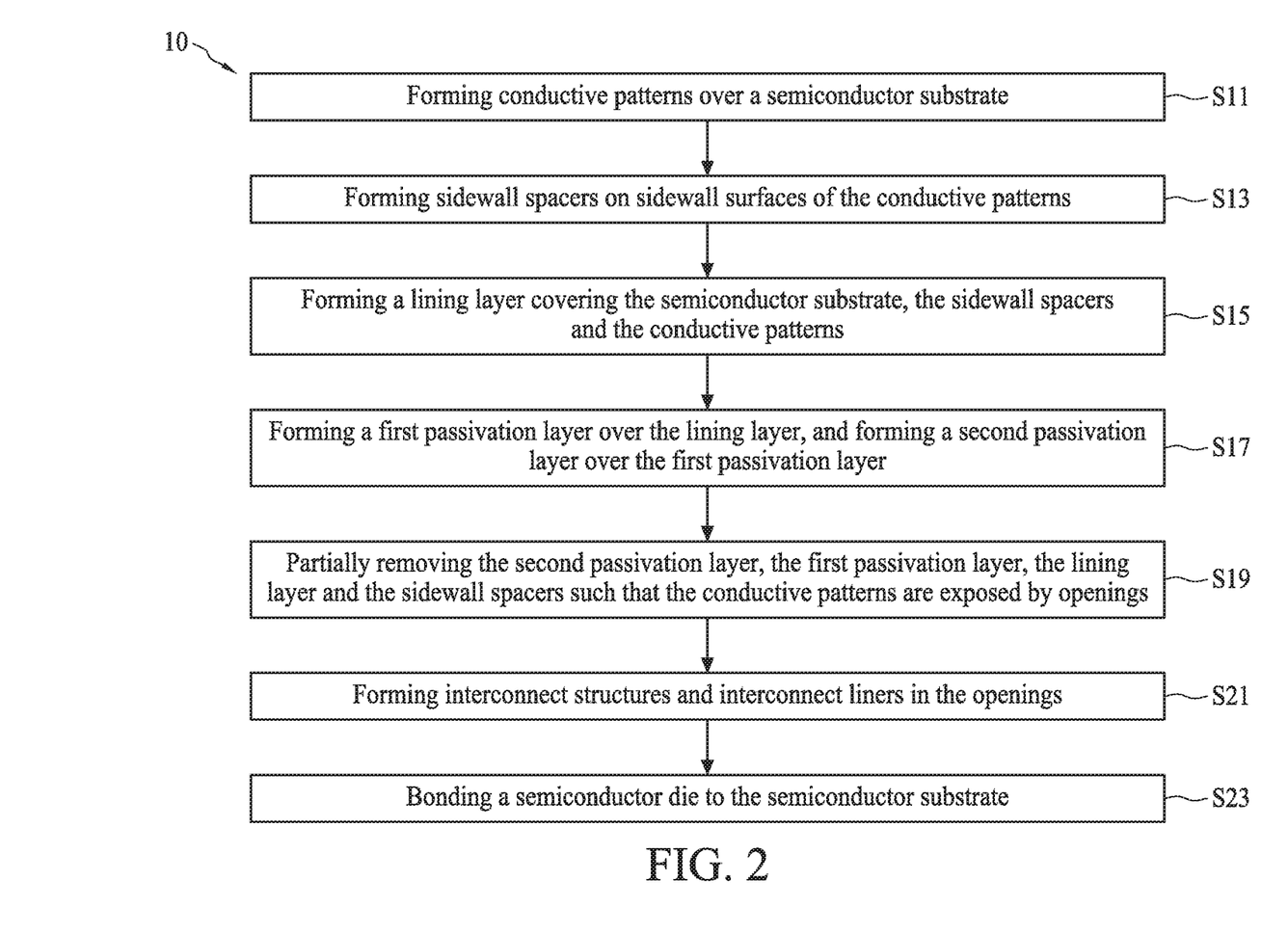
FIG. 2 is a flow diagram illustrating a method of forming a semiconductor device, in accordance with some embodiments.

FIG. 2 is a flow diagram illustrating a method 10 of forming the semiconductor device 100, wherein the method 10 includes steps S11, S13, S15, S17, S19, S21 and S23, in accordance with some embodiments. The steps S11 to S23 of FIG. 2 are elaborated in connection with following figures.

FIGS. 3 to 10 are cross-sectional views illustrating intermediate stages in the formation of the semiconductor device 100, in accordance with some embodiments.

Figure 3:
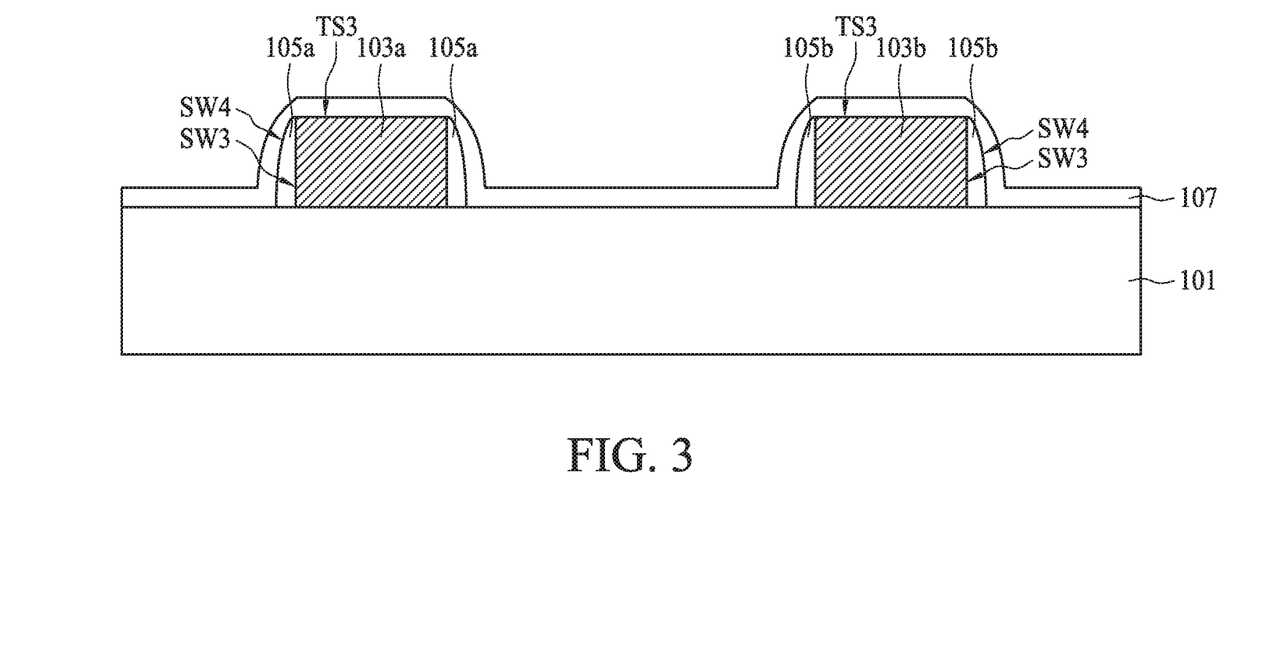
FIG. 3 is a cross-sectional view illustrating an intermediate stage in the formation of a semiconductor device, in accordance with some embodiments.

As shown in FIG. 3, the semiconductor substrate 101 is provided. The semiconductor substrate 101 may be a portion of an integrated circuit (IC) chip that includes various passive and active microelectronic devices, such as resistors, capacitors, inductors, diodes, p-type field effect transistors (pFETs), n-type field effect transistors (nFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin field-effect transistors (FinFETs), other suitable IC components, or combinations thereof.

Depending on the IC fabrication stage, the semiconductor substrate 101 may include various material layers (e.g., dielectric layers, semiconductor layers, and/or conductive layers) configured to form IC features (e.g., doped regions, isolation features, gate features, source/drain features, interconnect features, other features, or combinations thereof). The semiconductor substrate 101 has been simplified for the sake of clarity. It should be noted that additional features can be added in the semiconductor substrate 101, and some of the features described below can be replaced, modified, or eliminated in other embodiments.

The conductive patterns 103a and 103b are formed over the semiconductor substrate 101, in accordance with some embodiments. The respective step is illustrated as the step S11 in the method 10 shown in FIG. 2. In some embodiments, the conductive patterns 103a and 103b are made of copper (Cu), copper alloy, aluminum (Al), aluminum alloy, tungsten (W), tungsten alloy, titanium (Ti), titanium alloy, tantalum (Ta), tantalum alloy, or a combination thereof. Alternatively, other applicable conductive materials may be used.

In some embodiments, the conductive patterns 103a and 103b are formed by a deposition process and an etching process. The deposition process may be a chemical vapor deposition (CVD) process, a physical vapor deposition (PVD) process, an atomic layer deposition (ALD) process, a spin coating process, a sputtering process, or another applicable process. The etching process may include a dry etching process or a wet etching process, and may be performed by using a patterned mask as an etching mask.

Moreover, sidewall spacers 105a are formed on the sidewall surfaces SW3 of the conductive pattern 103a, and sidewall spacers 105b are formed on the sidewall surfaces SW3 of the conductive pattern 103b, in accordance with some embodiments. The respective step is illustrated as the step S13 in the method 10 shown in FIG. 2. In the depicted embodiment, the sidewall spacers 105a and 105b are made of silicon nitride. In some other embodiments, the sidewall spacers 105a and 105b are made of silicon oxide, silicon oxynitride, another applicable dielectric material, or a combination thereof.

In some embodiments, the sidewall spacers 105a and 105b are formed by a deposition process and an etching process. For example, a sidewall spacer material (not shown) is conformally deposited over the semiconductor substrate 101, the sidewall surfaces SW3 and the top surfaces TS3 of the conductive patterns 103a and 103b, and then, the sidewall spacer material is partially removed by an anisotropic etching process, which removes a similar amount of the sidewall spacer layer vertically in all places, leaving the sidewall spacers 105a and 105b along the sidewall surfaces SW3 of the conductive patterns 103a and 103b. In some embodiments, the etching process includes a dry etching process, a wet etching process, or a combination thereof.

Still referring to FIG. 3, a lining layer 107 is formed covering the semiconductor substrate 101, the sidewall surfaces SW4 of the sidewall spacers 105a and 105b, and the top surfaces TS3 of the conductive patterns 103a and 103b, in accordance with some embodiments. The respective step is illustrated as the step S15 in the method 10 shown in FIG. 2. In some embodiments, the lining layer 107 and the sidewall spacers 105a and 105b are made of the same material.

In the depicted embodiment, the lining layer 107 is made of silicon nitride. In some other embodiments, the lining layer 107 is made of silicon oxide, silicon oxynitride, another applicable dielectric material, or a combination thereof. Moreover, in some embodiments, the lining layer 107 is formed by a deposition process, such as CVD, PVD, ALD, spin coating, or another applicable process.

Figure 4:
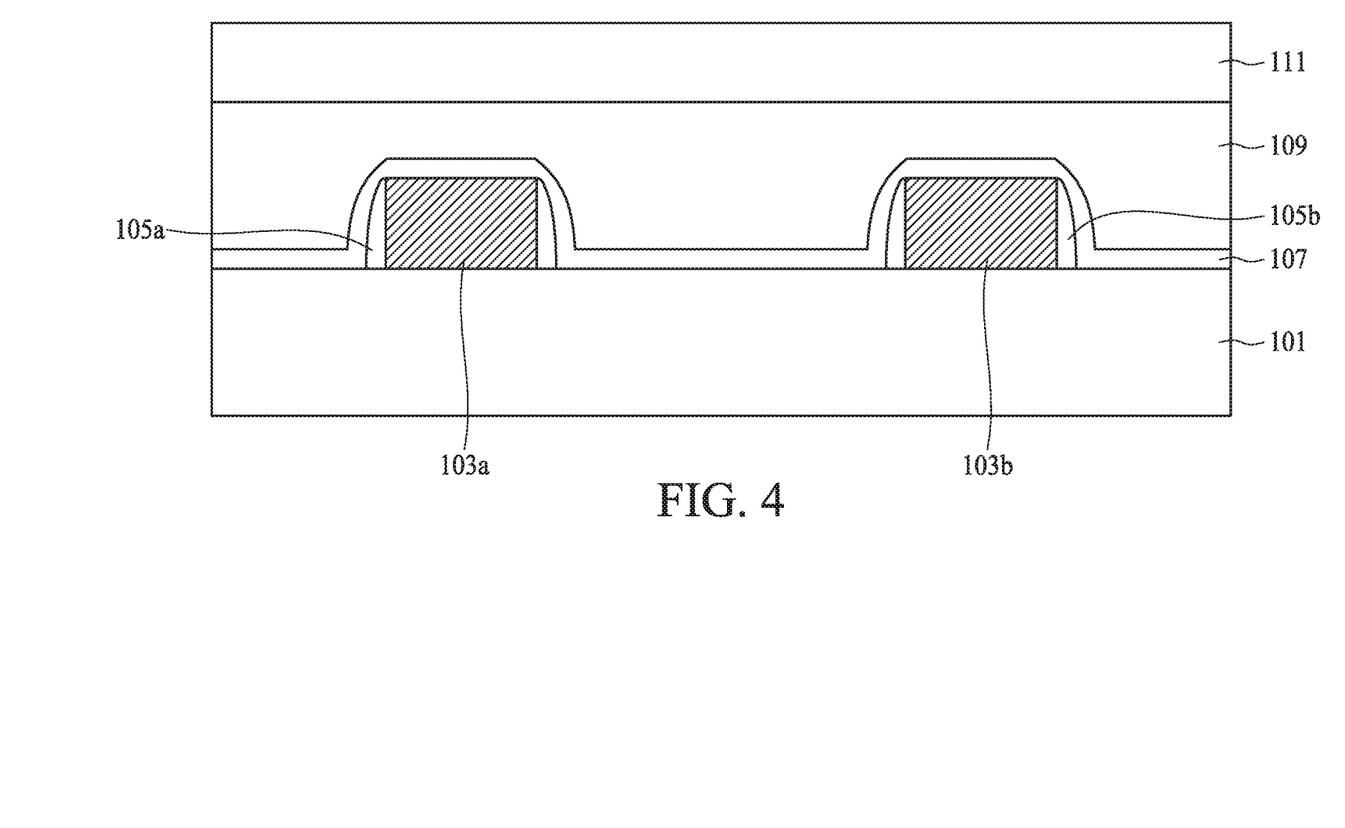
FIG. 4 is a cross-sectional view illustrating an intermediate stage in the formation of a semiconductor device, in accordance with some embodiments.

Next, a first passivation layer 109 is formed over the lining layer 107, and a second passivation layer 111 is formed over the first passivation layer 109, as shown in FIG. 4 in accordance with some embodiments. The respective step is illustrated as the step S17 in the method 10 shown in FIG. 2. In some embodiments, the first passivation layer 109 and the second passivation layer 111 are made of different materials. Moreover, in some embodiments, the second passivation layer 111, the lining layer 107 and the sidewall spacers 105a and 105b are made of the same material.

In the depicted embodiments, the first passivation layer 109 is made of silicon oxide, and the second passivation layer 111 is made of silicon nitride. In some other embodiments, the first passivation layer 109 and the second passivation layer 111 are made of silicon oxide, silicon nitride, silicon carbide, silicon oxynitride, silicon oxycarbide, silicon carbonitride, silicon oxide carbonitride, another applicable dielectric material, or a combination thereof.

In addition, the first passivation layer 109 and the second passivation layer 111 are formed by deposition processes. The deposition processes may be CVD, PVD, ALD, spin coating, or other applicable deposition processes. In some embodiments, the first passivation layer 109 and the second passivation layer 111 are formed individually.

Figure 5:
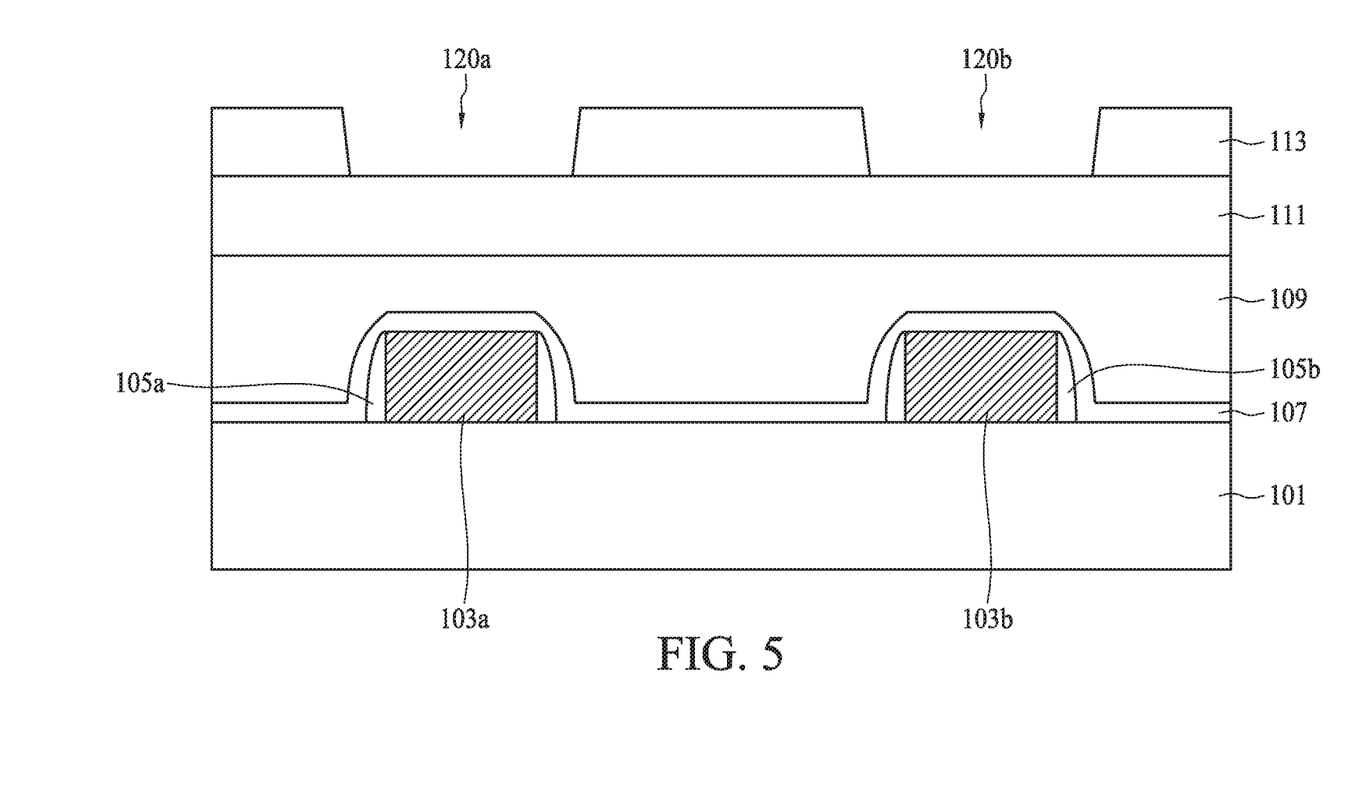
FIG. 5 is a cross-sectional view illustrating an intermediate stage in the formation of a semiconductor device, in accordance with some embodiments.

Next, a patterned mask 113 is formed over the second passivation layer 111, wherein the patterned mask 113 has openings 120a and 120b as shown in FIG. 5 in accordance with some embodiments. It should be noted that the openings 120a and 120b overlap the conductive patterns 103a and 103b, respectively, such that the openings 120a and 120b can be used to form openings, which expose the conductive patterns 103a and 103b in the subsequent processes.

In some embodiments, the patterned mask 113 is a patterned photoresist layer. Moreover, in some embodiments, the patterned mask 113 is formed by a deposition process and a patterning process. The deposition process for forming the patterned mask 113 may be CVD, high-density plasma CVD (HDPCVD), spin coating, sputtering, or another applicable process. The patterning process for forming the patterned mask 113 may include a photolithography process and an etching process. The photolithography process may include photoresist coating (e.g., spin coating), soft baking, mask aligning, exposure, post-exposure baking, developing the photoresist, rinsing and drying (e.g., hard baking). The etching process may include a dry etching process or a wet etching process.

Figure 6:
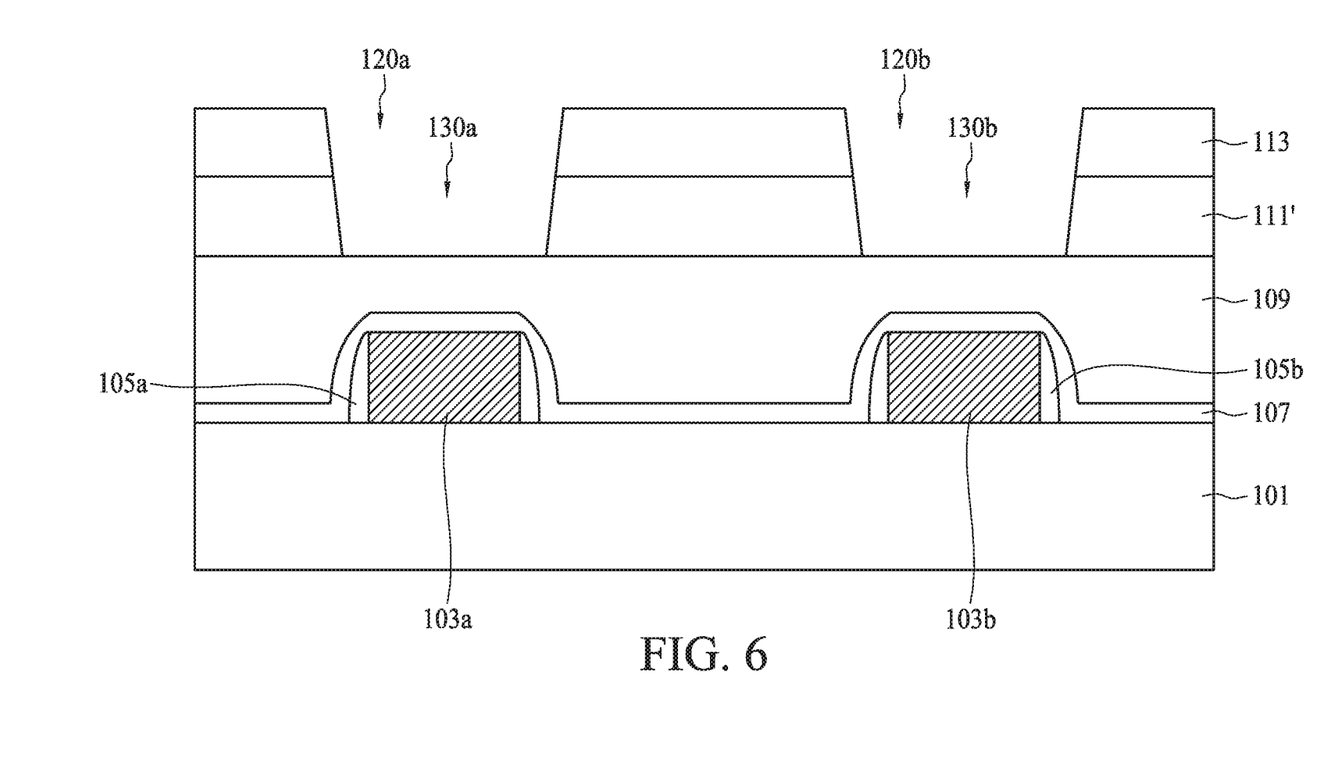
FIG. 6 is a cross-sectional view illustrating an intermediate stage in the formation of a semiconductor device, in accordance with some embodiments.

After the patterned mask 113 is formed, the second passivation layer 111 is partially removed by an etching process using the patterned mask 113 as an etching mask, such that openings 130a and 130b are formed in the remaining second passivation layer 111', as shown in FIG. 6 in accordance with some embodiments. The etching process for forming the openings 130a and 130b may be a dry etching process, a wet etching process, or a combination thereof. It should be noted that the first passivation layer 109 is exposed by the openings 130a and 130b of the remaining second passivation layer 111'.

Figure 7:
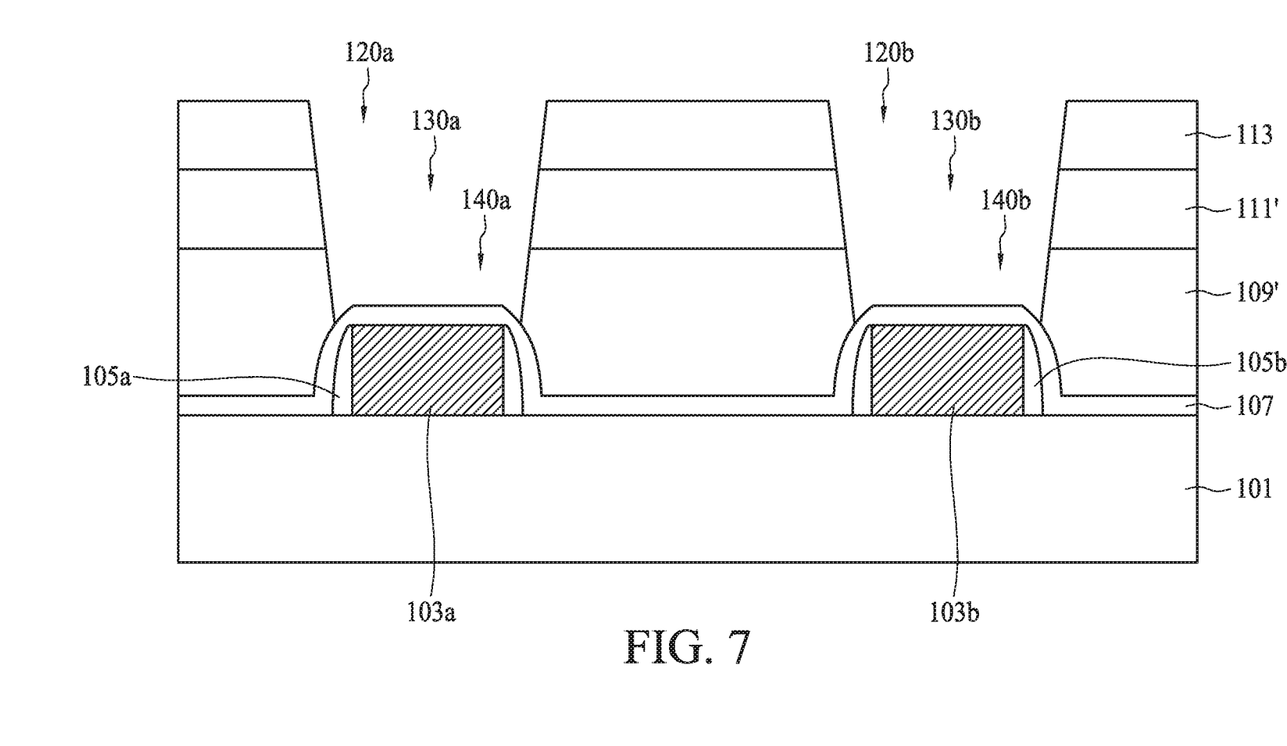
FIG. 7 is a cross-sectional view illustrating an intermediate stage in the formation of a semiconductor device, in accordance with some embodiments.

Next, the first passivation layer 109 is partially removed through the openings 130a and 130b of the second passivation layer 111', such that openings 140a and 140b are formed in the remaining first passivation layer 109', as shown in FIG. 7 in accordance with some embodiments. The etching process for forming the openings 140a and 140b may be a dry etching process, a wet etching process, or a combination thereof. It should be noted that the lining layer 107 is exposed by the openings 140a and 140b of the remaining first passivation layer 109'.

Figure 8:
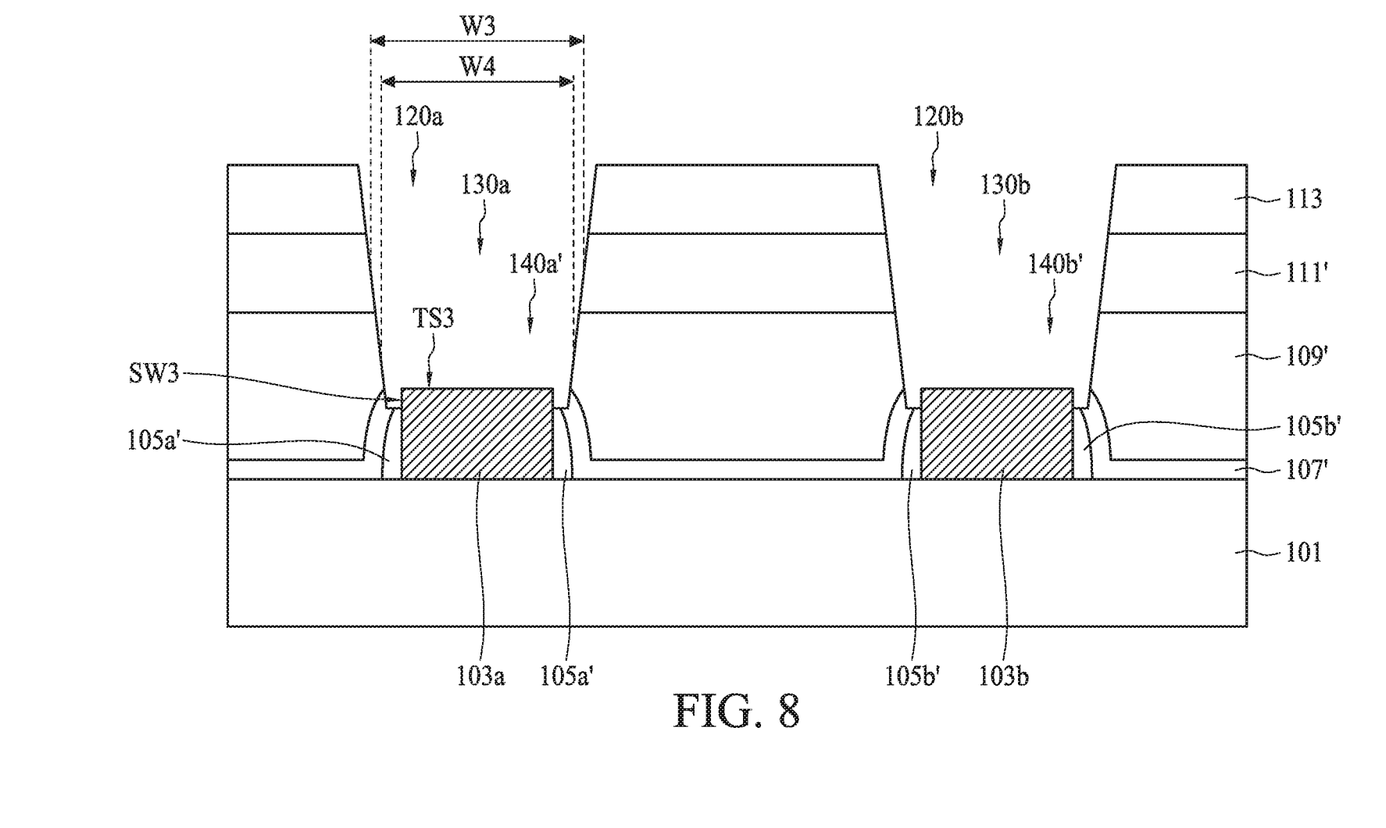
FIG. 8 is a cross-sectional view illustrating an intermediate stage in the formation of a semiconductor device, in accordance with some embodiments.

Next, the lining layer 107 and the sidewall spacers 105a and 105b are partially removed through the openings 140a and 140b of the first passivation layer 109', such that deepened openings 140a' and 140b' are obtained, as shown in FIG. 8 in accordance with some embodiments. The respective step is illustrated as the step S19 in the method 10 shown in FIG. 2. The etching process for forming the deepened openings 140a' and 140b' may be a dry etching process, a wet etching process, or a combination thereof.

It should be noted that the top surfaces TS3 and the sidewall surfaces SW3 of the conductive patterns 103a and 103b are exposed by the openings 140a' and 140b', in accordance with some embodiments. In some embodiments, the openings 120a, 130a and 140a' constitute a tapered opening structure, which is tapered from the top portion to the bottom portion. Similarly, the openings 120b, 130b and 140b' constitute a tapered opening structure, which is tapered from the top portion to the bottom portion.

Specifically, the opening 130a has a width W3, and the opening 140a' has a width W4. The width W3 is located at the middle portion of the opening 130a, and the width W4 is located at the middle portion of the opening 140a'. In some embodiments, the width W3 is greater than the width W4. After the conductive patterns 103a and 103b are exposed by the openings 140a' and 140b', the etched sidewall spacers 105a' and 105b' and the etched lining layer 107' are obtained.

Figure 9:
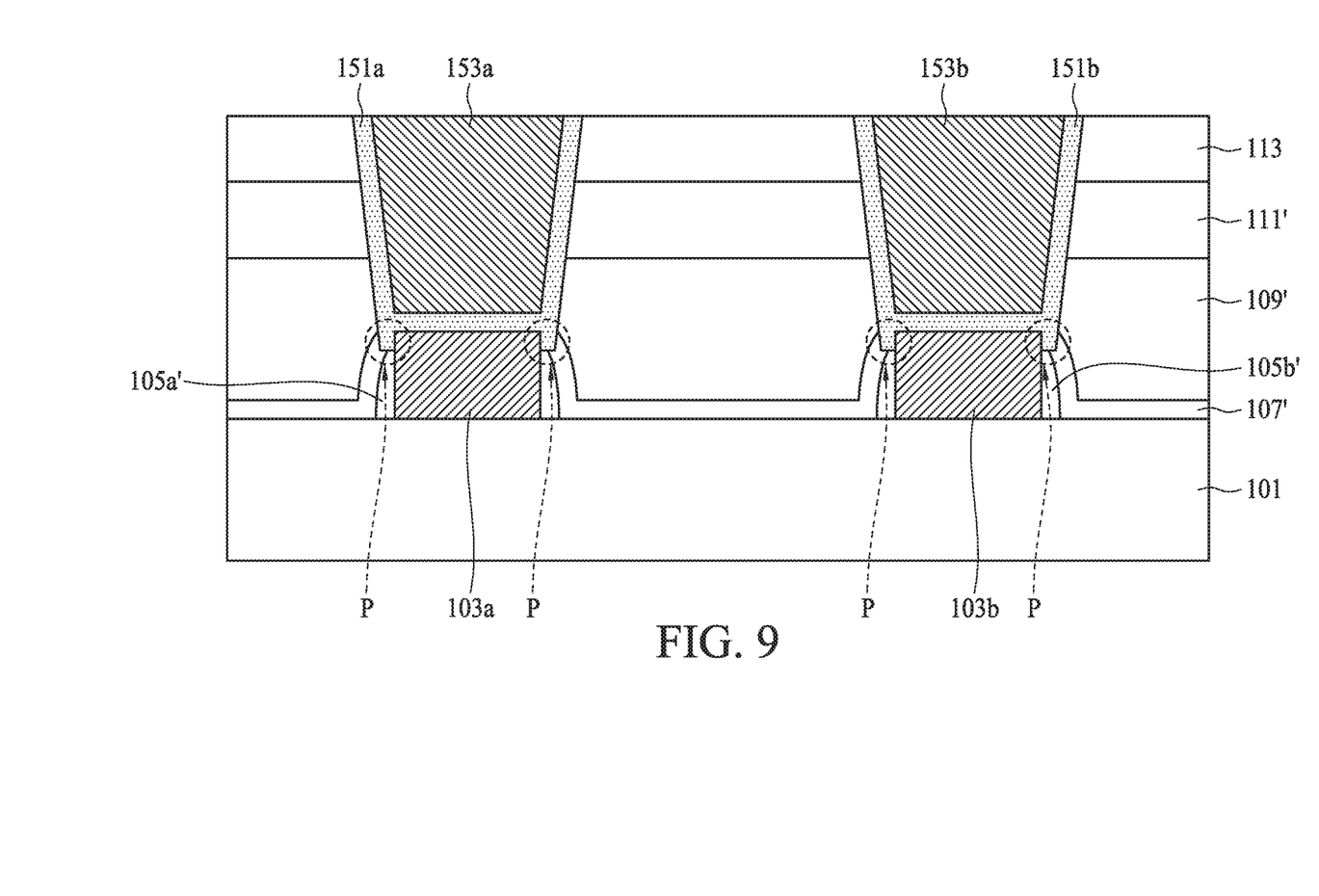
FIG. 9 is a cross-sectional view illustrating an intermediate stage in the formation of a semiconductor device, in accordance with some embodiments.

Next, an interconnect lining layer 151a and an interconnect filling layer 153a are deposited into the openings 120a, 130a and 140a', and an interconnect lining layer 151b and an interconnect filling layer 153b are deposited into the openings 120b, 130b and 140b', as shown in FIG. 9 in accordance with some embodiments. In some embodiments, the interconnect filling layers 153a and 153b are separated from the conductive patterns 103a and 103b by the interconnect lining layers 151a and 151b, and the interconnect filling layers 153a and 153b are surrounded by the interconnect lining layers 151a and 151b.

It should be noted that the interconnect lining layers 151a and 151b have protruding portions P, which are in direct contact with the sidewalls SW3 (see FIG. 9) of the conductive patterns 103a and 103b, in accordance with some embodiments. Moreover, the protruding portions P are sandwiched between the lining layer 107' and the conductive patterns 103a and 103b, in accordance with some embodiments.

In some embodiments, the interconnect lining layers 151a and 151b are made of tantalum (Ta), tantalum nitride (TaN), titanium (Ti), titanium nitride (TiN), cobalt tungsten (CoW) or another applicable material, and the interconnect lining layers 151a and 151b are formed by electroplating, CVD, PVD, ALD or another applicable process.

In some embodiments, the interconnect filling layers 153a and 153b are made of copper Cu), tungsten (W), cobalt (Co), titanium (Ti), aluminum (Al), tantalum (Ta), or another applicable material, and the interconnect filling layers 153a and 153b are formed by electroplating, CVD, PVD, ALD or another applicable process.

Figure 10:
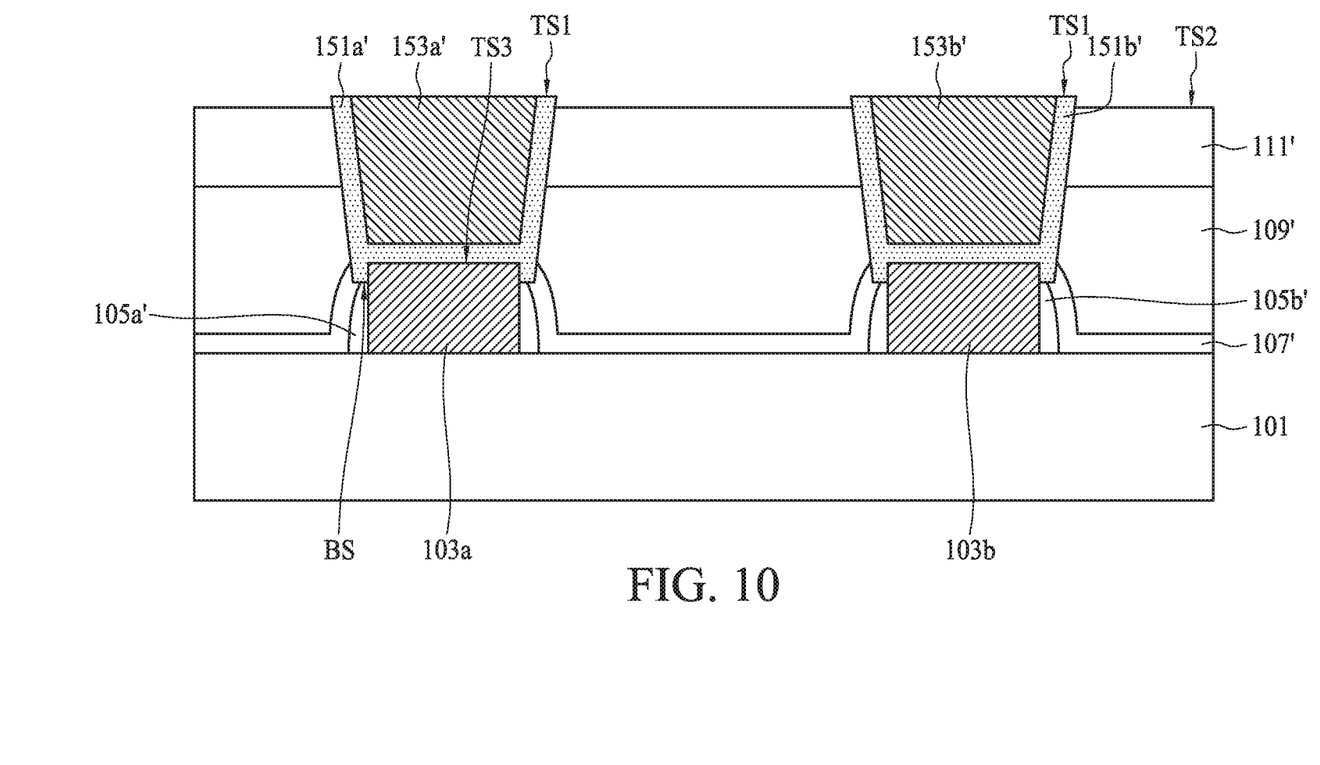
FIG. 10 is a cross-sectional view illustrating an intermediate stage in the formation of a semiconductor device, in accordance with some embodiments.

After the openings 120a, 120b, 130a, 130b, 140a' and 140b' are filled by the interconnect lining layers 151a, 151b and the interconnect filling layers 153a, 153b, a planarization process is performed on the structure of FIG. 9 to remove the patterned mask 113 and form the interconnect liners 151a', 151b' and the interconnect structures 153a', 153b', as shown in FIG. 10 in accordance with some embodiments. The respective step is illustrated as the step S21 in the method 10 shown in FIG. 2. The planarization process may be a chemical mechanical polishing (CMP) process.

It should be noted that, after the planarization process, the top surfaces of the interconnect structures 153a' and 153b' are substantially coplanar with the top surfaces TS1 of the interconnect liners 151a' and 151b', in accordance with some embodiments. Within the context of this disclosure, the word "substantially" means preferably at least 90%, more preferably 95%, even more preferably 98%, and most preferably 99%.

In some embodiments, the top surfaces TS1 of the interconnect liners 151a' and 151b' are higher than the top surface TS2 of the second passivation layer 111' after the planarization process. Moreover, in some embodiments, the top surfaces TS3 of the conductive patterns 103a and 103b are higher than the bottom surfaces BS of the interconnect liners 151a' and 151b'.

Next, the semiconductor die 201 is bonded to the semiconductor substrate 101 with the conductive pads 203a and 203b facing the interconnect structures 153a' and 153b', as shown in FIG. 1 in accordance with some embodiments. The respective step is illustrated as the step S23 in the method 10 shown in FIG. 2.

In some embodiments, the conductive pads 203a and 203b are in direct contact with the interconnect structures 153a' and 153b'. In some embodiments, the conductive pads 203a and 203b are in direct contact with the interconnect liners 151a' and 151b' and the interconnect structures 153a' and 153b'. After the semiconductor die 201 is bonded to the semiconductor substrate 101, the semiconductor device 100 is obtained. In addition, since the top surfaces TS1 of the interconnect liners 151a' and 151b' (or the top surfaces of the interconnect structures 153a' and 153b') are higher than the top surface TS2 of the second passivation layer 111', an electrical pathway may be formed by the conductive elements (e.g., the conductive pads 203a, 203b, the conductive liners 205a, 205b, the interconnect structures 153a', 153b', and the interconnect liners 151a', 151b'). contact prior to the contact between the dielectric elements (e.g., the second passivation layer 111' and the dielectric portions of the semiconductor die 201)

As mentioned above, the conductive pads 203a and 203b are used to electrically connect the devices in the semiconductor die 201 to other semiconductor structures bonded with the semiconductor die 201. The conductive pads 203a and 203b may be made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another applicable conductive material, and the conductive liners 205a, 205b may be made of tantalum (Ta), tantalum nitride (TaN), titanium (Ti), titanium nitride (TiN), cobalt tungsten (CoW) or another applicable material.

Embodiments of the semiconductor device 100 and method for preparing the same are provided. The semiconductor device 100 includes the conductive patterns 103*a*, 103*b* over the semiconductor substrate 101, the interconnect structures 153*a*', 153*b*' over the conductive patterns 103*a*, 103*b*, and the semiconductor die 201 bonded to the semiconductor substrate 101 such that the conductive pads 203*a* and 203*b* of the semiconductor die 201 are electrically connected to the conductive patterns 103*a* and 103*b* over the semiconductor substrate 101. The semiconductor device 100 also includes the interconnect liners 151*a*', 151*b*' between the interconnect structures 153*a*', 153*b*' and the conductive patterns 103*a*, 103*b*, and the interconnect structures 153*a*', 153*b*' are surrounded by the interconnect liners 151*a*', 151*b*'.

Since the maximum distance D between the outer sidewall surfaces SW2 of the interconnect liner 151*a*' or 151*b*' is greater than the width W1 of the conductive pattern 103*a* or 103*b*, the contact area between the interconnect structures 153*a*' and 153*b*' and the conductive pads 203*a* and 203*b* of the semiconductor die 201 is greater than the contact area when the conductive patterns 103*a* and 103*b* are in direct contact with the conductive pads 203*a* and 203*b* without forming the interconnect structures 153*a*', 153*b*' and the interconnect liners 151*a*', 151*b*'. Such greater contact area may cause a corresponding decrease of the resistance between the interconnect structures 153*a*' and 153*b*' and the conductive pads 203*a* and 203*b*. As a result, the overall device performance may be improved.

Moreover, the interconnect structures 153*a*', 153*b*' and the interconnect liners 151*a*', 151*b*' are tapered structures, which are tapered from top portions to bottom portions. Therefore, necking effect and undesirable voids, which are easily formed by filling of openings, may be reduced or eliminated in the interconnect structures 153*a*', 153*b*' and the interconnect liners 151*a*', 151*b*', and the overall device performance may be improved.

Furthermore, since the interconnect liners 151*a*' and 151*b*' have protruding portions P in direct contact with the sidewall surfaces SW3 of the conductive patterns 103*a* and 103*b*, the contact area between the interconnect liners 151*a*' and 151*b*' and the conductive patterns 103*a* and 103*b* is greater than the contact area when the interconnect liners 151*a*' and 151*b*' only contact the top surfaces TS3 of the conductive patterns 103*a* and 103*b*, and such greater contact area reduces the resistance between the interconnect liners 151*a*' and 151*b*' and the conductive patterns 103*a* and 103*b*. As a result, the overall device performance may be improved.

In one embodiment of the present disclosure, a semiconductor device is provided. The semiconductor device includes a conductive pattern formed over a semiconductor substrate, and an interconnect structure formed over the conductive pattern. The semiconductor device also includes an interconnect liner formed between the interconnect structure and the conductive pattern and surrounding the interconnect structure. The inner sidewall surfaces of the interconnect liner are in direct contact with the interconnect structure, and a maximum distance between outer sidewall surfaces of the interconnect liner is greater than a width of the conductive pattern. The semiconductor device further includes a semiconductor die bonded to the semiconductor substrate. The semiconductor die includes a conductive pad facing the interconnect structure, and the conductive pad is electrically connected to the conductive pattern.

In another embodiment of the present disclosure, a semiconductor device is provided. The semiconductor device includes a conductive pattern formed over a semiconductor substrate, and an interconnect structure formed over the conductive pattern. The semiconductor device also includes an interconnect liner formed between the interconnect structure and the conductive pattern and surrounding the interconnect structure. The interconnect liner has a protruding portion in direct contact with a sidewall surface of the conductive pattern. The semiconductor device further includes a semiconductor die bonded to the semiconductor substrate. The semiconductor die includes a conductive pad, and the conductive pad is electrically connected to the conductive pattern through the interconnect structure and the interconnect liner.

In one embodiment of the present disclosure, a method for preparing a semiconductor device is provided. The method includes forming a conductive pattern over a semiconductor substrate, and forming a sidewall spacer on a sidewall surface of the conductive pattern. The method also includes forming a first passivation layer covering the conductive pattern and the sidewall spacer, and removing a portion of the first passivation layer and a portion of the sidewall spacer such that a top surface and the sidewall surface of the conductive pattern are exposed by a first opening. The method further includes forming an interconnect liner and an interconnect structure in the first opening, wherein the interconnect structure is separated from the conductive pattern by the interconnect liner. In addition, the method includes bonding a semiconductor die to the semiconductor substrate. The semiconductor die includes a conductive pad facing the interconnect structure, wherein the conductive pad is electrically connected to the conductive pattern.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
   a conductive pattern disposed over a semiconductor substrate;
   an interconnect structure disposed over the conductive pattern;
   an interconnect liner disposed between the interconnect structure and the conductive pattern and surrounding the interconnect structure, wherein inner sidewall surfaces of the interconnect liner are in direct contact with the interconnect structure, and a maximum distance between outer sidewall surfaces of the interconnect liner is greater than a width of the conductive pattern; and
   a semiconductor die bonded to the semiconductor substrate, wherein the semiconductor die comprises a conductive pad facing the interconnect structure, and the conductive pad is electrically connected to the conductive pattern;
wherein a width of the interconnect structure is greater than the width of the conductive pattern.

2. The semiconductor device of claim 1, wherein the interconnect liner has a protruding portion in direct contact with a sidewall surface of the conductive pattern.

3. The semiconductor device of claim 2, further comprising:
a sidewall spacer disposed on the sidewall surface of the conductive pattern, wherein the protruding portion of the interconnect liner is in direct contact with the sidewall spacer.

4. The semiconductor device of claim 3, further comprising:
a lining layer covering the semiconductor substrate and a sidewall surface of the sidewall spacer, wherein a material of the lining layer is the same as a material of the sidewall spacer.

5. The semiconductor device of claim 4, further comprising:
a first passivation layer disposed over the lining layer and surrounding the interconnect liner; and
a second passivation layer disposed over the first passivation layer and surrounding the interconnect liner, wherein the interconnect structure and the interconnect liner protrude from the second passivation layer.

6. The semiconductor device of claim 5, wherein the first passivation layer is made of silicon oxide, and the second passivation layer, the lining layer and the sidewall spacer are made of silicon nitride.

7. A semiconductor device, comprising:
a conductive pattern disposed over a semiconductor substrate;
an interconnect structure disposed over the conductive pattern;
an interconnect liner disposed between the interconnect structure and the conductive pattern and surrounding the interconnect structure, wherein the interconnect liner has a protruding portion in direct contact with a sidewall surface of the conductive pattern;
a semiconductor die bonded to the semiconductor substrate, wherein the semiconductor die comprises a conductive pad, and the conductive pad is electrically connected to the conductive pattern through the interconnect structure and the interconnect liner;
a sidewall spacer disposed on the sidewall surface of the conductive pattern; and
a lining layer covering the semiconductor substrate and the sidewall spacer, wherein the sidewall spacer is enclosed by the protruding portion of the interconnect liner, the conductive pattern, the semiconductor substrate and the lining layer.

8. The semiconductor device of claim 7, wherein a topmost point of the lining layer is higher than a bottom surface of the protruding portion of the interconnect liner.

9. The semiconductor device of claim 7, further comprising:
a first passivation layer disposed over the lining layer; and
a second passivation layer disposed over the first passivation layer, wherein the first passivation layer and the second passivation layer are made of different materials, and
wherein the first passivation layer and the second passivation layer adjoin a sidewall surface of the interconnect liner, and a top surface of the interconnect liner is higher than a top surface of the second passivation layer.

10. The semiconductor device of claim 7, wherein the interconnect structure has a tapered width, which is tapered from a top portion to a bottom portion.

11. The semiconductor device of claim 7, wherein the conductive pad is in direct contact with the interconnect structure and the interconnect liner.

12. A method for preparing a semiconductor device, comprising:
forming a conductive pattern over a semiconductor substrate;
forming a sidewall spacer on a sidewall surface of the conductive pattern;
forming a first passivation layer covering the conductive pattern and the sidewall spacer;
removing a portion of the first passivation layer and a portion of the sidewall spacer such that a top surface and the sidewall surface of the conductive pattern are exposed by a first opening;
forming an interconnect liner and an interconnect structure in the first opening, wherein the interconnect structure is separated from the conductive pattern by the interconnect liner; and
bonding a semiconductor die to the semiconductor substrate, wherein the semiconductor die comprises a conductive pad facing the interconnect structure, and the conductive pad is electrically connected to the conductive pattern.

13. The method for preparing a semiconductor device of claim 11, wherein the interconnect structure is separated from the first passivation layer by the interconnect liner, and the top surface of the conductive pattern is higher than a bottom surface of the interconnect liner.

14. The method for preparing a semiconductor device of claim 11, further comprising:
forming a lining layer covering the semiconductor substrate, the sidewall spacer and the conductive pattern before the first passivation layer is formed, wherein a material of the lining layer is different from a material of the first passivation layer.

15. The method for preparing a semiconductor device of claim 14, wherein the lining layer is partially removed during the step of forming the first opening.

16. The method for preparing a semiconductor device of claim 14, wherein the interconnect liner has a protruding portion sandwiched between the lining layer and the conductive pattern.

17. The method for preparing a semiconductor device of claim 11, further comprising:
forming a second passivation layer over the first passivation layer before the first opening is formed; and
removing a portion of the second passivation layer to form a second opening before the first opening is formed, wherein a width of the second opening is greater than a width of the first opening.

18. The method for preparing a semiconductor device of claim 17, wherein a top surface of the interconnect liner is higher than a top surface of the second passivation layer before the semiconductor die is bonded to the semiconductor substrate.

* * * * *